(12) United States Patent
Tokuyama

(10) Patent No.: US 8,115,103 B2
(45) Date of Patent: Feb. 14, 2012

(54) FLEXIBLE PRINTED BOARD, ELECTRONIC APPARATUS MOUNTED WITH THIS, AND FOLDING METHOD FOR FLEXIBLE PRINTED BOARD

(75) Inventor: Mayumi Tokuyama, Saitama (JP)

(73) Assignee: NEC Corporation, Tokyo (JP)

( * ) Notice: Subject to any disclaimer, the term of this patent is extended or adjusted under 35 U.S.C. 154(b) by 411 days.

(21) Appl. No.: 12/374,368

(22) PCT Filed: Jul. 13, 2007

(86) PCT No.: PCT/JP2007/063976
§ 371 (c)(1),
(2), (4) Date: Jan. 19, 2009

(87) PCT Pub. No.: WO2008/013070
PCT Pub. Date: Jan. 31, 2008

(65) Prior Publication Data
US 2010/0016039 A1    Jan. 21, 2010

(30) Foreign Application Priority Data
Jul. 25, 2006  (JP) ................................ 2006-201448

(51) Int. Cl.
*H05K 1/00* (2006.01)
(52) U.S. Cl. ........................................................ 174/254
(58) Field of Classification Search .................... 361/749
See application file for complete search history.

(56) References Cited

U.S. PATENT DOCUMENTS

| | | | | | |
|---|---|---|---|---|---|
| 5,760,997 | A | * | 6/1998 | Koyanagi et al. | 360/97.01 |
| 5,917,158 | A | * | 6/1999 | Takao et al. | 174/254 |
| 6,118,666 | A | * | 9/2000 | Aoki et al. | 361/749 |
| 6,153,832 | A | * | 11/2000 | Gaarder | 174/254 |
| 7,652,849 | B2 | * | 1/2010 | Nozaki et al. | 360/264.2 |
| 2005/0088830 | A1 | | 4/2005 | Yumoto et al. | |

FOREIGN PATENT DOCUMENTS

| | | |
|---|---|---|
| JP | 4-263495 A | 9/1992 |
| JP | 2002141989 A | 5/2002 |
| JP | 2003-158355 A | 5/2003 |
| JP | 3098782 | 3/2004 |
| JP | 2004-135012 A | 4/2004 |
| JP | 2004-247352 A | 9/2004 |
| JP | 2004-247653 A | 9/2004 |
| JP | 2005-057554 A | 3/2005 |
| JP | 2005-101112 A | 4/2005 |
| JP | 2006-108476 A | 4/2006 |
| JP | 2007073924 A | 3/2007 |

OTHER PUBLICATIONS

International Search Report for PCT/JP2007/063976 mailed Oct. 9, 2007.
Japanese Office Action for JP2006-201448 issued Jun. 14, 2011.
International Preliminary Report on Patentability for PCT/JP2007/063976 issued Jan. 27, 2009.
Supplementary European Search Report for EP 07 79 0757 completed Jan. 19, 2010.

* cited by examiner

Primary Examiner — Thanh Tam Le

(57) ABSTRACT

In order to attempt to save a mounting region of a flexible printed board and to miniaturize electric equipment for the printed board to be mounted, the flexible printed board includes a terminal board section having terminals and an interconnection board section having interconnections to be connected to the terminals. The flexible printed board is formed to be foldable such that a terminal neighboring section of the interconnection board section, which is adjacent to the terminal board section, is put on a surface of the terminal board section opposite to a terminal formation surface thereof.

13 Claims, 12 Drawing Sheets

FLEXIBLE PRINTED BOARD, ELECTRONIC APPARATUS MOUNTED WITH THIS, AND FOLDING METHOD FOR FLEXIBLE PRINTED BOARD

This application is the National Phase of PCT/JP2007/063976, filed Jul. 13, 2007, which claims priority to Japanese Patent Application No. 2006-201448, filed on Jul. 25, 2006, the disclosure of which is incorporated herein in its entirety by reference.

TECHNICAL FIELD

The present invention relates to a flexible printed board, and in particular, relates to a flexible printed board which is used by folding a given portion.

BACKGROUND ART

In recent years, a flexible printed board is used in various electronic devices. For example, this is especially a necessary electronic component in case of a folding type cellular phone in which an operation section and a display section are connected through a hinge section, in order to connect the operation section and the display section. More specifically, in a folding type cellular phone, an interconnection board section which is formed to be bendable to pass through the hinge section, is arranged, and terminal board sections formed at both ends are connected to other boards and parts mounted within each housing.

Here, one example of a flexible printed board used for a folding cellular phone is disclosed in Japanese Patent Application Publication (JP-P2004-247653A). A flexible printed board disclosed in this citation employs a structure that the flexible printed board to which an interconnection board section with symmetric bilateral shapes and terminal board sections are formed, is folded for stacking such that a singe layer in which interconnections are formed, is sufficient even when the terminal board sections are formed at both ends.

DISCLOSURE OF INVENTION

On the other hand, in recent years, a mounting region of electronic parts like the above-mentioned flexible printed board is narrowing, following the miniaturization of cellular phones. Particularly, it is difficult to secure the mounting region on a main board which is mounted in a housing, and securing a region where a terminal board section is mounted, is an important when the above-mentioned flexible printed board is used.

In addition to the above difficulty, since a lot of interconnections to be connected to terminals formed on the terminal board section are present, an interconnection region in the vicinity of a terminal board section tends to have a large width. Additionally, the interconnection region in the vicinity of the terminal board section is almost united with the terminal board section mounted to the main board, so that it is included as a region required for mounting. That is to say, the terminal board section and the interconnection region in the vicinity thereof are a mounting region, and securing the region is more and more difficult. In other words, there is a problem that the miniaturization of an electronic device for mounting is difficult when a mounting region of a flexible printed board is to be secured.

Therefore, an object of the present invention is to improve disadvantages of the above conventional example, especially, to save a space of a mounting region of a flexible printed board and miniaturize an electronic device on which the flexible printed board is mounted.

A flexible printed board of the present invention has a first terminal board section with a plurality of terminals arranged on a terminal formation surface, and a first interconnection board section having a plurality of interconnections to be connected to the plurality of terminals. The first interconnection board section has a first terminal neighboring section, which is adjacent to the first terminal board section, and a first interconnection section which is adjacent to the first terminal neighboring section. The width of a portion where the plurality of interconnections are arranged, is wider in the first terminal neighboring section than in the first interconnection section. A boundary between the first terminal board section and the first terminal neighboring section is formed to be foldable such that the first terminal neighboring section is put on a surface of the first terminal board section opposite to the terminal formation surface.

The present invention, which is configured and functions as mentioned above. Thus, since a terminal neighboring section (the first terminal neighboring section) is put on the terminal board section (the first terminal board section), the presence of a region for the terminal board section is sufficient for a mounting region to make it possible to save a space of the mounting region of the flexible printed board and miniaturize an electronic equipment for the printed board to be mounted.

BEST MODE FOR CARRYING OUT THE INVENTION

One feature of the present invention lies in that a space of a mounting region is saved by folding a part of an interconnection board section adjacent to a terminal board section of a flexible printed board to be put on the terminal board section. Specific configurations and mounting methods will be described below according to exemplary embodiments.

First Exemplary Embodiment

Figure 1:
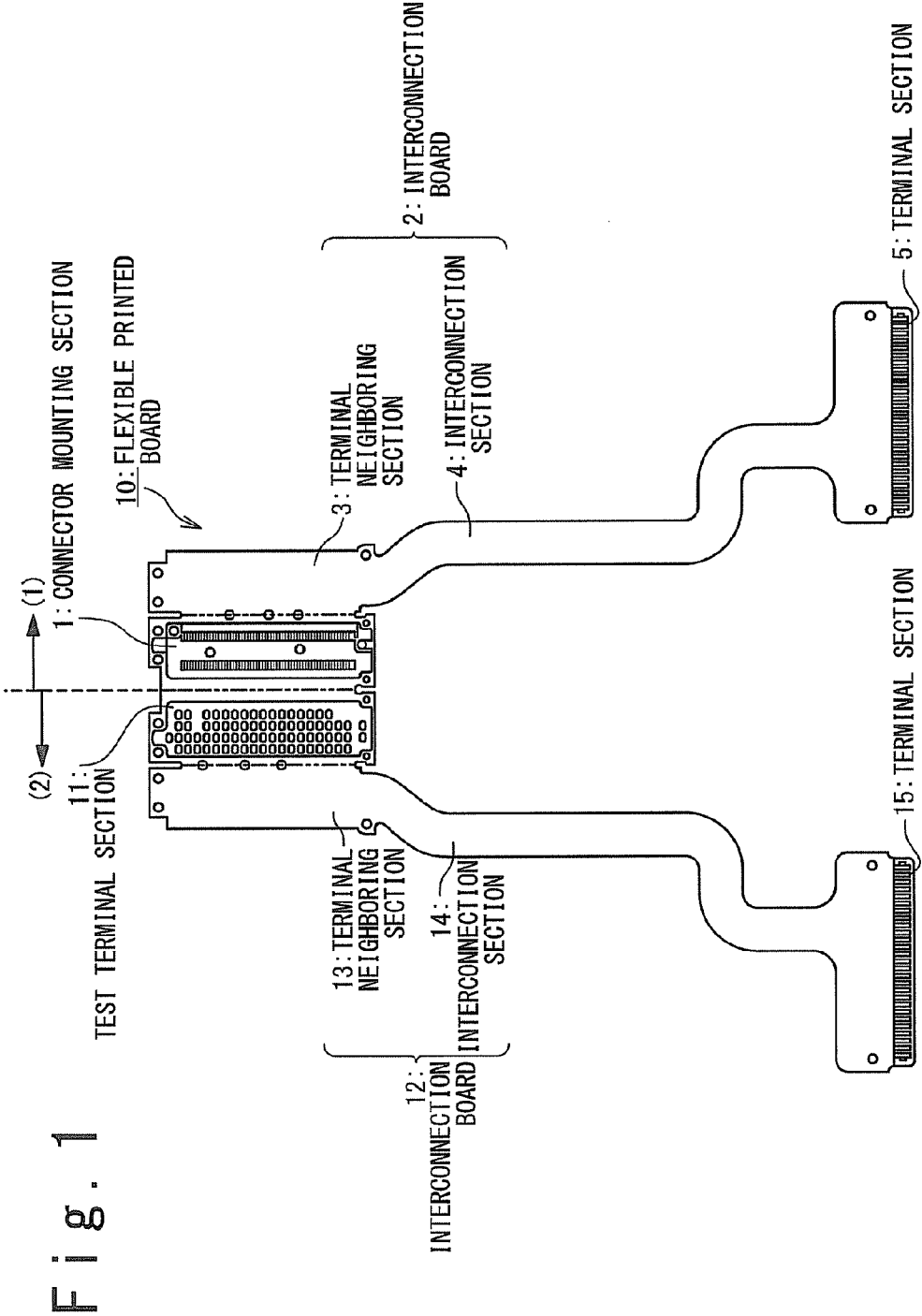
FIG. 1 shows a configuration of a flexible printed board according to a first exemplary embodiment of the present invention.
Figure 2:
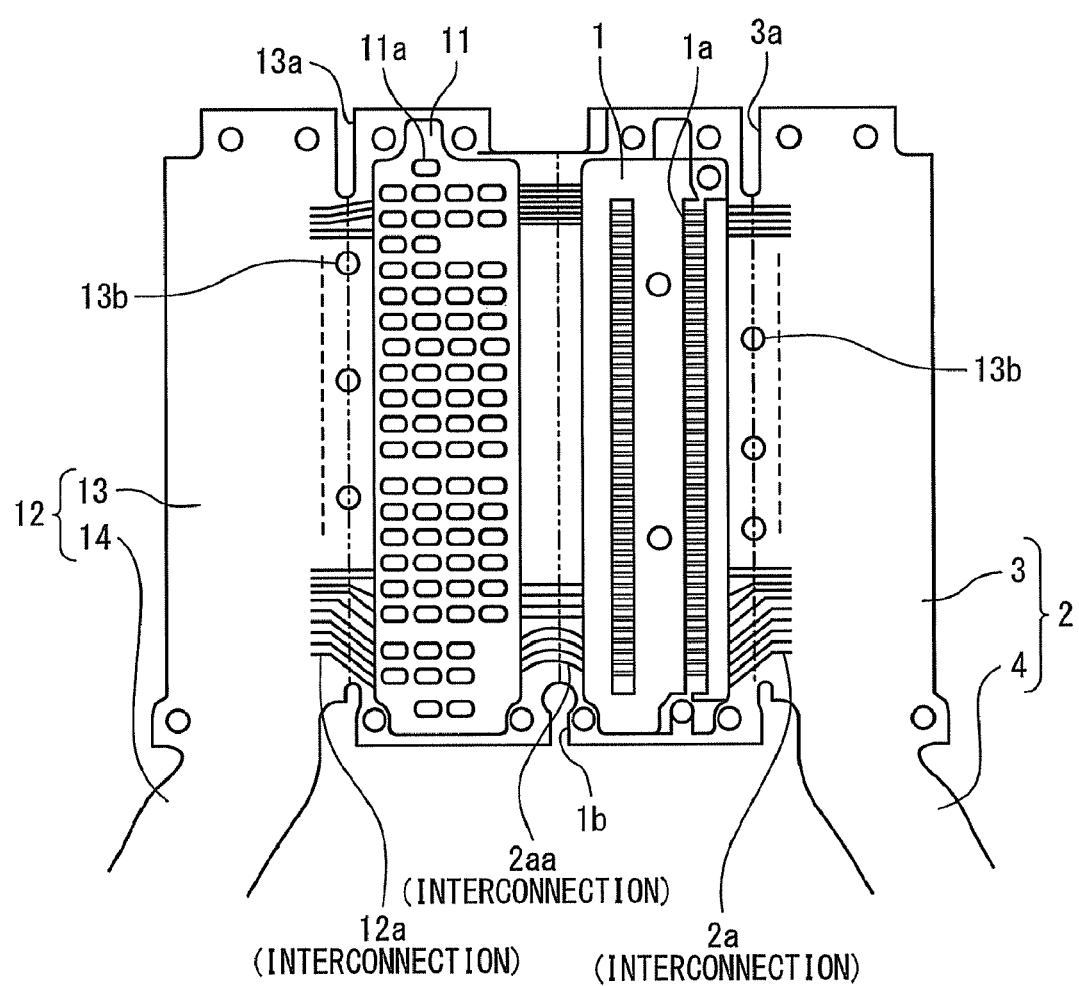
FIG. 2 is an enlarged view of a part of the flexible printed board shown in FIG. 1.
Figure 5A:
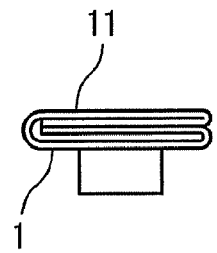
FIG. 5A is an explanatory diagram showing the folding method of the flexible printed board shown in FIG. 1.
Figure 5B:
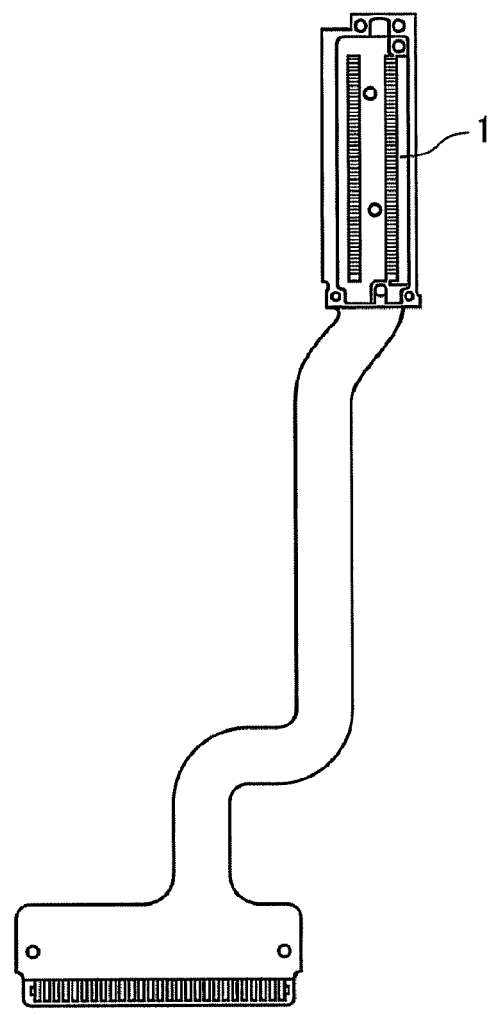
FIG. 5B is an explanatory diagram showing the folding method of the flexible printed board shown in FIG. 1.
Figure 6:
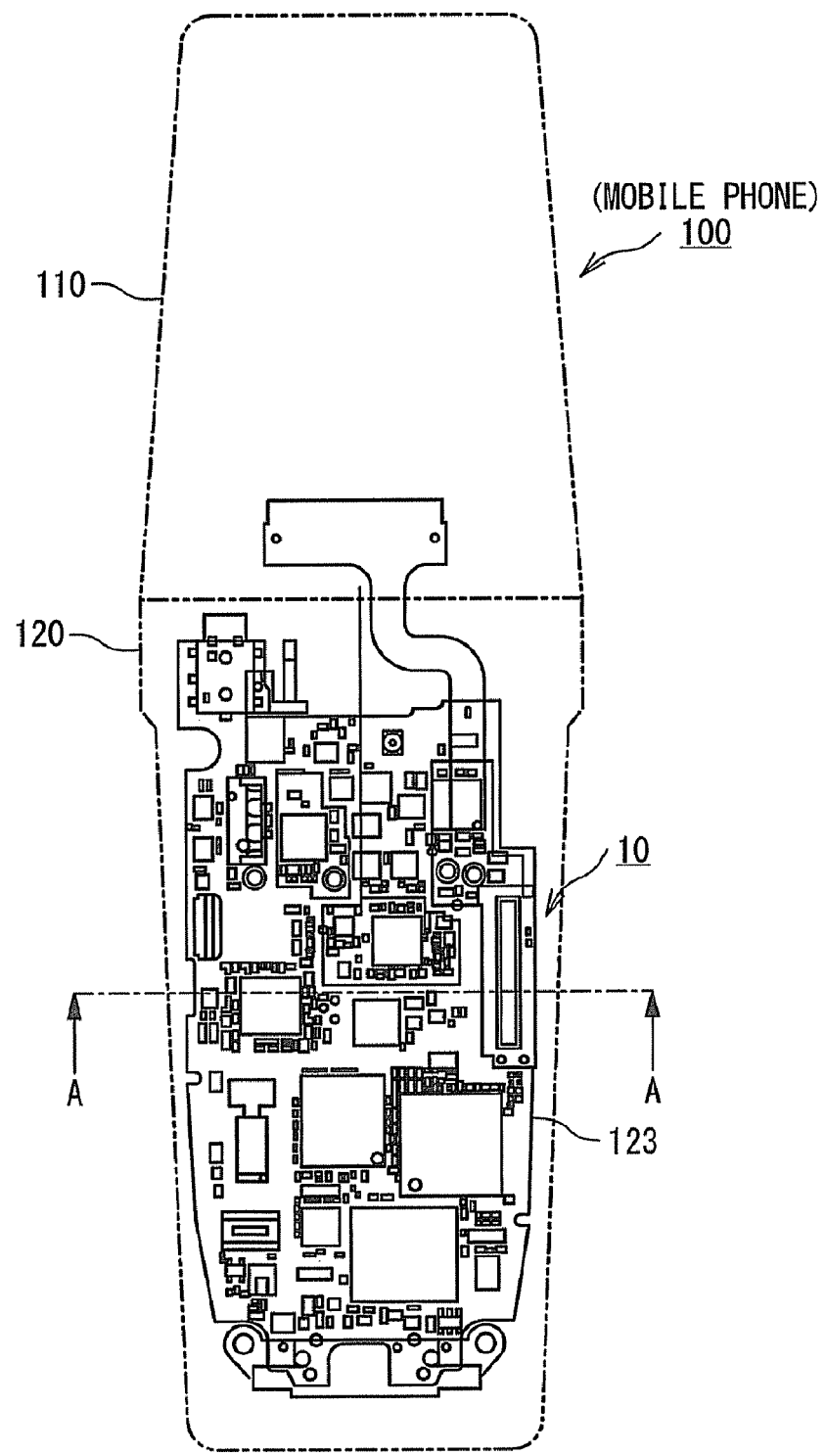
FIG. 6 shows a state that the flexible printed board shown in FIGS. 5A and 5B is mounted on a cellular phone.
Figure 7:
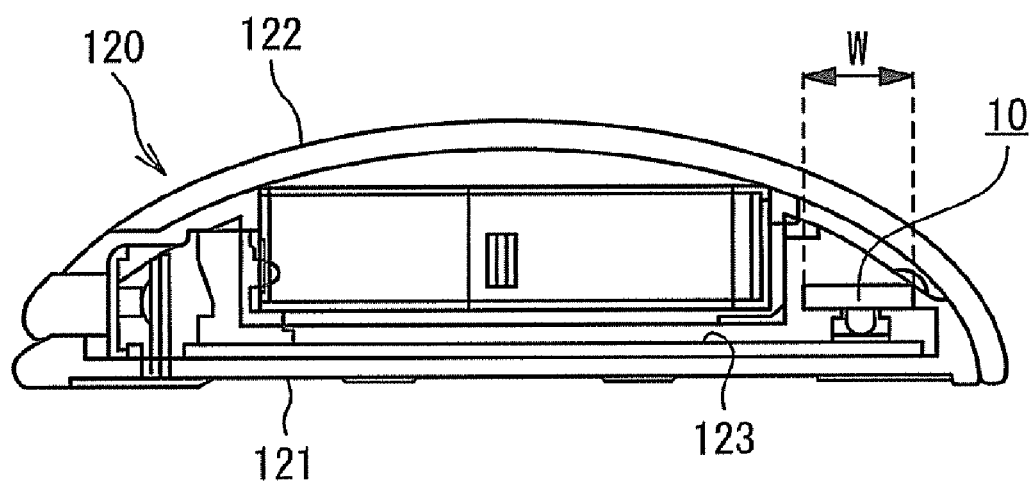
FIG. 7 is a sectional view showing a sectional configuration of a cellular phone along an A-A line.

The printed board according to a first exemplary embodiment of the present invention will be described with reference to FIGS. 1 to 7. FIGS. 1 and 2 show a configuration of a flexible printed board according to the first exemplary embodiment. FIGS. 3A to 5 are diagrams for showing a folding method of the flexible printed board. FIGS. 6 and 7 show a state in which the flexible printed board is mounted to a cellular phone.

Although a case where a flexible printed board is mounted to a cellular phone, is exemplified in the first exemplary embodiment, a device for the printed board to be mounted is not limited to cellular phones, needless to say, and may be other electronic devices such as a PDA (Personal Digital Assistant), a personal computer, and an electronic dictionary.
(Configuration)

As shown in FIG. 1, a flexible printed board 10 according to the first exemplary embodiment is formed approximately symmetrically between the side of a symbol (1) (the right side of FIG. 1) and the side of a symbol (2) (the left side of FIG. 1), and has two interconnection boards (a first interconnection board section and a second interconnection board section) 2 and 12 with terminal sections formed at both ends. Connection is performed on the side of the one end of the two interconnection boards 2 and 12 (the side of the upper end in FIG. 1).

First, the side of the symbol (1), namely, a portion of the right side of FIG. 1, will be described. The interconnection board 2 (the first interconnection board section) provided on the side of the symbol (1) of the flexible printed board 10 has a terminal neighboring section 3 (a first terminal neighboring section) formed on the side of one end thereof (the side of the upper end of FIG. 1), a terminal section 5 formed on the side of the other end (the side of the lower end of FIG. 1), and an interconnection section 4 (a first interconnection section) in the form of a crank, to which a plurality of interconnections are formed for connecting both the end sections. Additionally, a connector mounting section 1 (a first terminal board section), which is a board provided with terminals, is provided adjacent to the terminal neighboring section 3. The connector mounting section 1 is connected with the side of the symbol (2) which is symmetrically formed, as mentioned later.

The interconnection section 4 is formed by attaching two interconnection layers each other, in which a plurality of interconnections are formed, although being not shown, and corresponding terminals of the connector mounting section 1 and the terminal section 5 provided at both the ends are connected by these interconnections.

The connector mounting section 1 is formed in an approximately a rectangular shape, and a plurality of male terminals to be mounted on a board of a cellular phone are formed in the connector mounting section 1. The plurality of terminals are formed on one side (a terminal formation surface) of the connector mounting section 1. More specifically, as shown in an enlarged view of FIG. 2, the plurality of terminals 1a are formed in two lines along a longitudinal direction of the connector mounting section 1, namely, parallel to a long side of the rectangular shape.

The terminal neighboring section 3 of the above-mentioned interconnection board 2 is connected in adjacent to the right side of the connector mounting section 1. More in detail, the terminal neighboring section 3 is formed in parallel along the long side of the rectangular connector mounting section 1 and has approximately the same shape (rectangle) as the connector mounting section 1. In the terminal neighboring section 3, the interconnections extending from the above-mentioned interconnection section 4 are connected to the respective terminals 1a. At this time, a number of interconnections are accommodated in a space-saved region in the interconnection section 4, since interconnections are formed in two layers. The interconnections are arranged on a region wider than the region of the interconnection section 4 in the terminal neighboring section 3 so as to be connected to the terminals 1a arranged along the long side of the connector mounting section 1, as shown symbol 2a of FIG. 2 (part of the interconnections 2a are not shown). That is to say, the interconnections formed in two layers in the width shown in FIG. 1 in the interconnection section 4 are arranged to be distributed over the width of the longitudinal direction (the width of the long side) of the terminal neighboring section 3 to correspond to the positions of the respective terminals 1a in the terminal neighboring section 3, immediately before being connected to the respective terminals 1a of the connector mounting section 1. For this reason, the terminal neighboring section 3 on the interconnection board 2 adjacent to the connector mounting section 1 necessarily has a large area. Additionally, the interconnection section 4 is connected on the side of the short side of the terminal neighboring section 3.

The connector mounting section 1 and the terminal neighboring section 3 are formed a continuous portion by a single polyimide layer and so forth, and a notch section 3a along the long side and circular through-holes 3b are formed in the boundary of them, to be made weaker in strength than other portions (the periphery). As a result, the boundary between the connector mounting section 1 and the terminal neighboring section 3 (the two-dot chain line) is formed so as to be foldable, as will be mentioned below. Additionally, the boundary may be formed with low strength using other methods, or the strength of a portion to be folded does not need to be formed with low strength if the strength of the flexible printed board 1 originally has foldable strength.

The portion (on the left side of FIG. 1) indicated by the symbol (2) of the flexible printed board 10 according to the first exemplary embodiment has the same configuration as the portion on the side of the symbol (1) which includes the connector mounting section 1, the interconnection board 2, and the terminal section 5, and the portions are symmetrically formed in a pair with respect to the dotted line in FIG. 1 (a folding line between the terminal board sections) as the center. More in detail, the portions are symmetrically formed so as to be connected to the long side of the connector mounting section 1 on the opposite side to the terminal neighboring section 3, as shown in FIG. 1. For example, the portions are formed continuously by a single polyimide layer and so forth.

Although the structure positioned on the left side indicated by the symbol (2) is approximately the same as the structure on the right side, a test terminal section 11 (a second terminal board section) as a board with terminals is provided for a portion connected to the connector mounting section 1. The test terminal section 11 is formed as a rectangle in the same way as the connector mounting section 1, and an interconnection board 12 (a second interconnection board section) is connected to the side of the long side opposite to the connection side to the connector mounting section 1. The interconnection board 12 and the above-mentioned interconnection board 2 on the right side are symmetrically formed. The connector mounting section 1 and the test terminal section 11 are provided to be line-symmetric with the boundary line (the folding line between the terminal board sections). For example, respective interconnections 12a are distributed over a wide region in correspondence to terminals 11a, namely, along the long side of the test terminal section 11, in the terminal neighboring section 13 (the second section adjacent to terminals) adjacent to the test terminal section 11, in the other words, over the width wider than the width of an interconnection section 14 (part of the interconnections 12a are not shown), as shown in FIG. 2. These interconnections are accommodated in two layers in the interconnection section 14 (the second interconnection section), extending to a terminal section 15. Additionally, the terminals 1a of the connector mounting section 1 and the terminals 11a of the test terminal section 11 are connected through respective interconnections 2aa (part of the interconnections 2aa are not shown). The interconnections 2aa extend to cross the boundary line between the connector mounting section 1 and the test terminal section 11 (the folding line between the terminal board sections).

A notch section 13a and through-holes 13b are formed on the boundary line between the test terminal section 11 and the terminal neighboring section 13 in the same way as mentioned above, so as to be foldable along the boundary line (see the two-dot chain line).

The folding line between the connector mounting section 1 and the test terminal section 11 (the folding line between the terminal board sections; see the two-dot chain line) too, has a notch section 1b along the folding line, which is formed to be foldable.

Here, the configuration of the above-mentioned connection portion (the upper portion) of the bilaterally symmetric flexible printed board 10 will be described in detail. As shown in FIGS. 1 to 2, the connector mounting section 1 and the terminal neighboring section 3 adjacent thereto, and the test terminal section 11 and the terminal neighboring section 13 adjacent thereto, are continuously formed by the single polyimide layer and the like, which are approximately equally divided into four as shown by the two-dot chain lines. Each of the four sections has a rectangular shape, and the single layer is bendable to make mountain-folds along the respective boundary lines (two-dot chain lines) as mentioned above.

A metal plate is provided on the surface opposite to a terminal formation surface of the connector mounting section 1 for the purpose of improving the strength of the connector mounting section 1. In addition, double-sided tapes are provided on both surfaces of each of the terminal neighboring sections 3 and 13, which will be stuck on faces in contact when the respective terminal neighboring sections are folded. It should be noted that other adhesive bonding materials for bonding faces in contact together may be provided instead of the double-sided tape, and bonding material may be applied on (filled into) a bonding face at the time of folding.

Here, the respective terminal neighboring sections 3 and 13 have been described to have approximately the same shape as the connector mounting section 1 and the test terminal section 11 adjacent thereto. However, the respective terminal neighboring sections 3 and 13 may be a smaller shape than the connector mounting section 1 and the test terminal section 11. That is to say, the respective terminal neighboring sections 3 and 13 may have shape and size so as to hide under the connector mounting section 1 and the test terminal section 11 when being folded on the connector mounting section 1 and the test terminal section 11, as will be mentioned later.

(Folding Method)

Next, a folding method of the flexible printed board 10 having the above-mentioned structure will be described with reference to FIGS. 3A to 5.

Figure 3A:
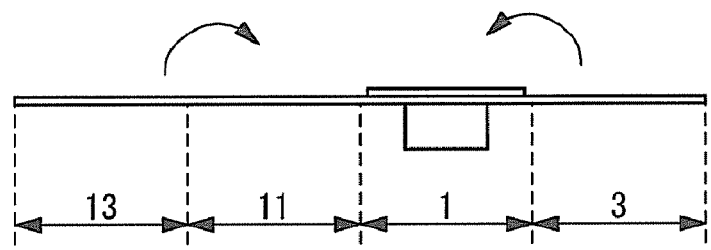
FIG. 3A is an explanatory diagram showing a folding method of the flexible printed board shown in FIG. 1.
Figure 3B:
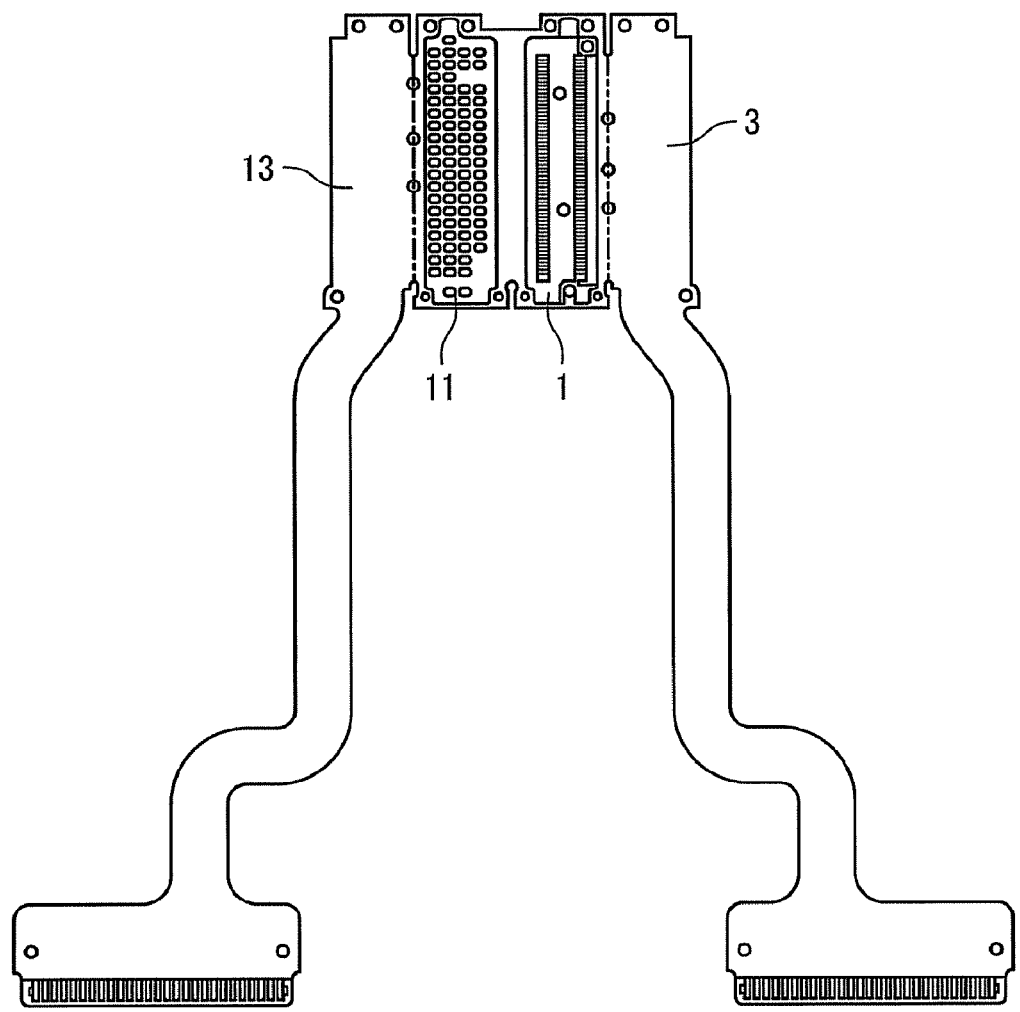
FIG. 3B is an explanatory diagram showing the folding method of the flexible printed board shown in FIG. 1.

First, FIG. 3B shows the flexible printed board 10 at the time of manufacturing before being folded, and FIG. 3A shows only the structure on the side of the upper end (the connector mounting section 1, the test terminal section 11, and the terminal neighboring sections 3 and 13) seen from above. That is to say, FIG. 3A is a side view of the flexible printed board 10 on the side of the terminal board section.

First, the terminal neighboring section 3 and 13 positioned at both ends are bended inward at the boundary (folding) lines with the connector mounting section 1 and the test terminal section 11 adjacent thereto (first step). In other words, the terminal neighboring section 3 and 13 are folded to make mountain-folds on the dotted lines shown in FIG. 3B. More specifically, the terminal neighboring section 3 positioned on the right end is folded to be put on the back side which is opposite to the terminal formation face of the connector mounting section 1. The terminal neighboring section 13 positioned on the left side is folded to put on the back side which is opposite to the terminal formation face of the test terminal section 11, as indicated by the arrow in FIG. 3A.

Figure 4A:
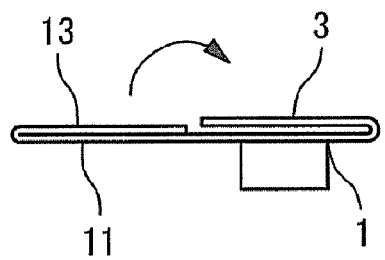
FIG. 4A is an explanatory diagram showing the folding method of the flexible printed board shown in FIG. 1.
Figure 4B:
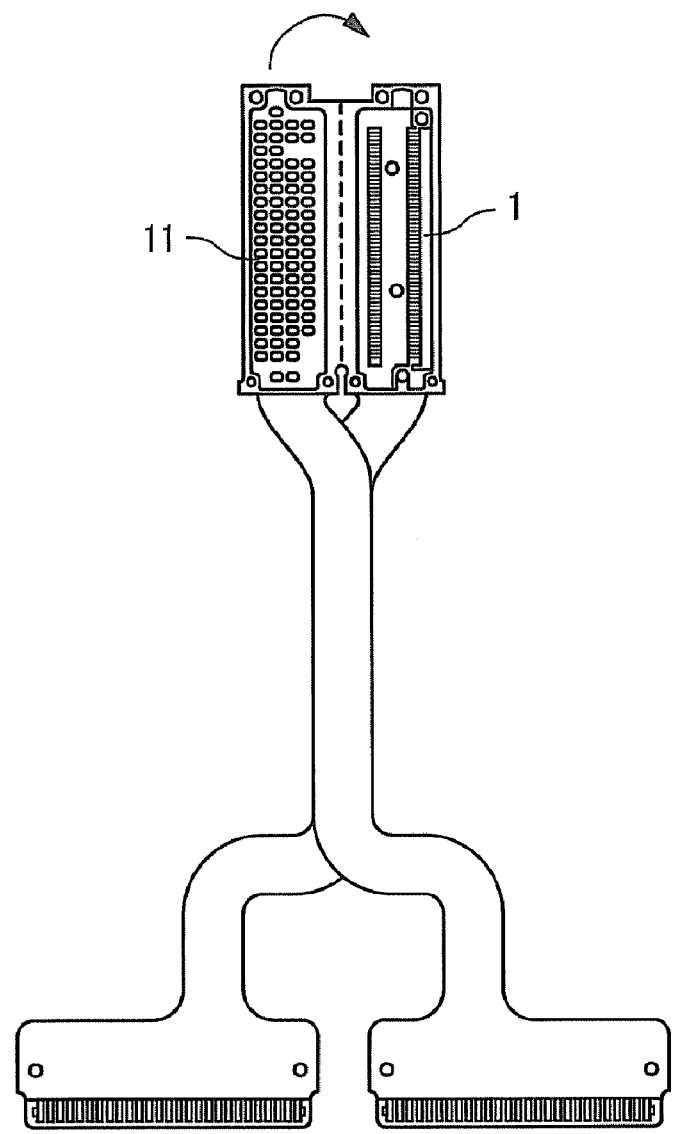
FIG. 4B is an explanatory diagram showing the folding method of the flexible printed board shown in FIG. 1.

As a result, the terminal neighboring sections 3 and 13 are positioned to be put on the back sides of the connector mounting section 1 and the test terminal section 11 respectively, as shown in FIGS. 4A and 4B. In accordance with this, the interconnection boards 2 and 12 are positioned with the left and right being reversed. At this time, since double-sided tapes are attached to the terminal neighboring sections 3 and 13, surfaces to face each other after folding, namely, the backs of the connector mounting section 1 and the terminal neighboring section 3, and the backs of the test terminal section 11 and the terminal neighboring section 13, are each stuck together with the double-sided tapes.

Next, the flexible printed board 10 is folded to make a mountain-fold along a dotted line shown in FIG. 4B, namely, along a boundary line between the connector mounting section 1 and the test terminal section 11 (the folding line between the terminal board sections) from the state shown in FIGS. 4A and 4B. More in detail, the test terminal section 11 and the terminal neighboring section 13, which are put on each other and positioned on the left side, are folded on the side of the connector mounting section 1 and the terminal neighboring section 3, which are put on each other and positioned on the right side, as shown by the arrows in FIGS. 4A and 4B. In other words, the flexible printed board 10 is folded such that the terminal neighboring sections 3 and 13 oppose to each other and are put on each other. Consequently, the connector mounting section 1 is positioned on the surface side while the test terminal section 11 is positioned on the back side, and the terminal neighboring sections 3 and 13 are layered therebetween, as shown in FIGS. 5A and 5B. At this time, the terminal neighboring sections 3 and 13, to which the double-sided tape is stuck, are fixed to each other. Furthermore, the interconnection boards 2 and 12 are also all put on each other.

As a result of the folding in the this way, the flexible printed board 10 can be formed to have the connector mounting section 1 and the test terminal section 11 on the surface and back sides. Therefore, a mounting region for the connector mounting section 1 is sufficient since the terminal neighboring sections 3 and 13 are put on the connector mounting section 1.

Next, the state that the flexible printed board 10 folded in the above way is mounted to a cellular phone will be described with reference to FIGS. 6 to 7. FIG. 6 shows a folding cellular phone 100 seen from the back side of an operation face, in which an upper section 110 having a display is shown upward and a lower section 120 having an operation face is shown downward. FIG. 7 shows a cross sectional state of the lower section 120 along the A-A line.

As shown in FIG. 7, the lower section 120 of the cellular phone 100 is surrounded by an operation section 121 and a cover 122 positioned on the back side thereof. A main board 123 is layered on the operation section 121. Then, the connector mounting section 1 of the flexible printed board 10 folded in the above way is mounted on a part of the main board 123. That is to say, the mounting is possible even in a mounting region for the area of the connector mounting section 1. The interconnection boards 2 and 12 put on each other are positioned to go toward the upper section 110 by passing through the hinge section and the terminal sections 5 and 15 are mounted within the upper section 110.

In this way, the flexible printed board having the above-mentioned structure can be mounted even when only a mounting region with the width shown by the symbol W in FIG. 7 can be secured in particular. That is to say, although a mounting region of a portion adjacent to the connector mounting section 1 usually has to be secured, the folding onto the connector mounting section 1 makes it possible to save a space of a mounting region as mentioned above.

Second Exemplary Embodiment

Next, another configuration and folding method of the flexible printed board will be described with reference to FIGS. 8 to 11. First, the configuration shown in FIG. 8 will be described.

Figure 8:
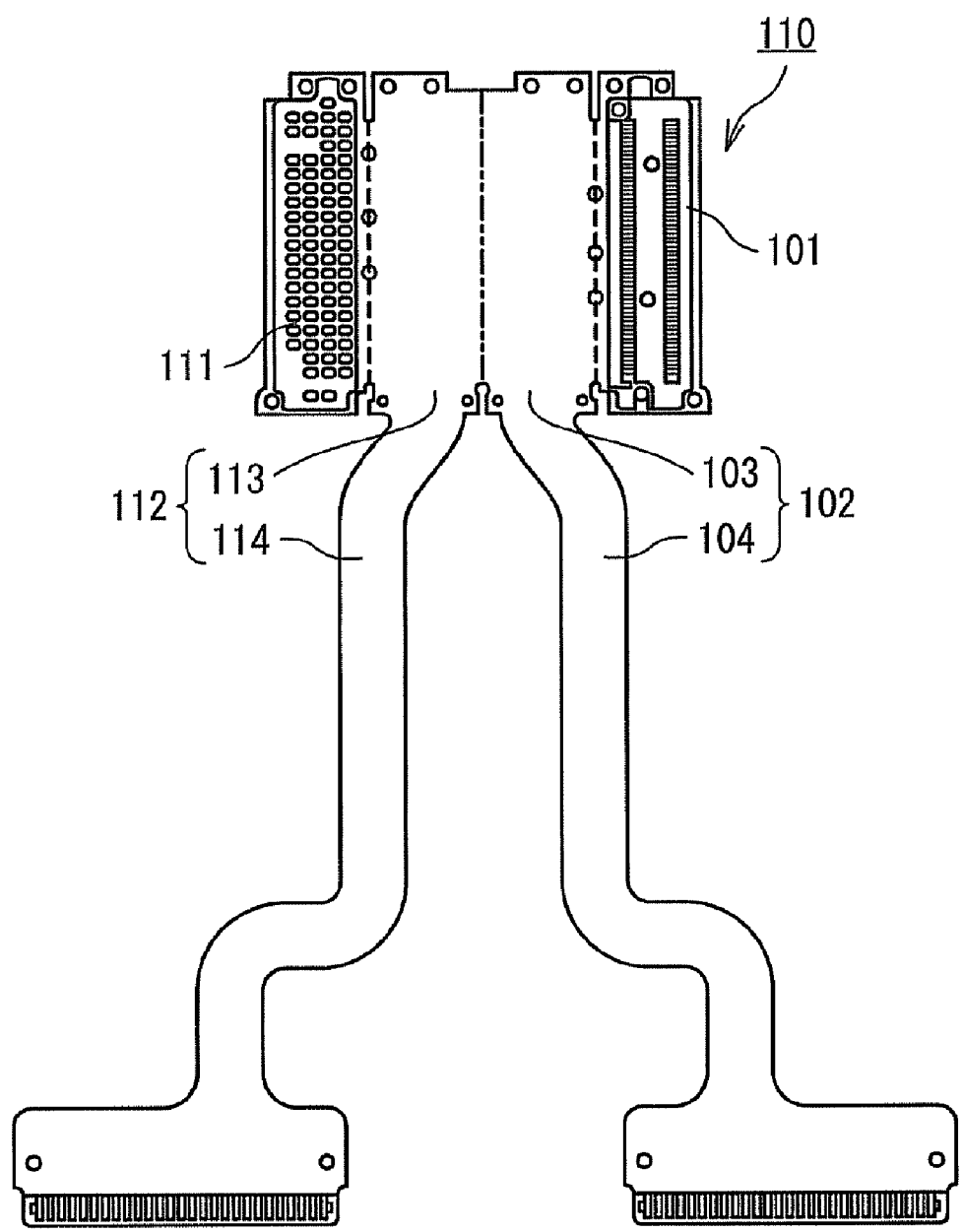
FIG. 8 shows another configuration and folding method of the flexible printed board according to a second exemplary embodiment of the present invention.

A flexible printed board 110 shown in FIG. 8 has connector mounting sections 101 and 111 (the first terminal board section 101 and the second terminal board section 111) positioned at both ends of the upper end portion, in which terminal neighboring sections 103 and 113 (a first terminal neighboring section 103 and a second terminal neighboring section 113), respectively connected thereto, are positioned therebetween by being connected with each other. That is to say, the board formed by a single polyimide layer and so forth is approximately equally divided into four sections at the upper end portion of the flexible printed board 110, as in FIG. 1. From the right, the connector mounting section 101, the terminal neighboring section 103 adjacent thereto, the other terminal neighboring section 113, and the other connector mounting section 111 connected thereto, are formed. The connector mounting section 101 is provided adjacent to one side of the terminal neighboring section 103. The terminal neighboring section 113 is provided adjacent on the other side of the terminal neighboring section 113. The connector mounting section 111 is provided adjacent to the terminal neighboring section 113 on the side opposite to the terminal neighboring section 103. The terminal neighboring sections 103 and 113 are each formed such that a boundary (folding) line (the chain line in FIG. 8, the folding line between the terminal board sections) is valley-foldable. Also, the connector mounting sections 101 and 111 and the terminal neighboring sections 103 and 113 are each formed such that the boundary (folding) lines thereof (the dotted lines in FIG. 8) are mountain-foldable. Interconnection boards 102 and 112 (the first interconnection board section 102 and the second interconnection board section 112) of the symmetric shapes are connected from the terminal neighboring sections 103 and 113. Interconnection sections 104 and 114 (a first interconnection section 104 and a second interconnection section 114) are connected to the terminal neighboring sections 103 and 113, respectively. That is to say, the terminal neighboring sections 103 and 113 have a bilaterally symmetric shape. The connector mounting section 101 and the connector mounting section 111 are axis-symmetrically positioned with respect to the boundary (folding) line between the terminal neighboring sections 101 and 111 (the folding line between the terminal board sections).

The connector mounting sections 101 and 111 are positioned on the surface and back sides as a result of the folding in accordance with the above-mentioned folding lines, and the terminal neighboring sections 103 and 113 are put therebetween. Consequently, a mounting region can be a minimum space since the connector mounting section 101 and 111, which serve as terminal surfaces, are exposed outside while the terminal neighboring sections 103 and 113 adjacent thereto can be put on each other, as in the first exemplary embodiment.

Figure 9A:
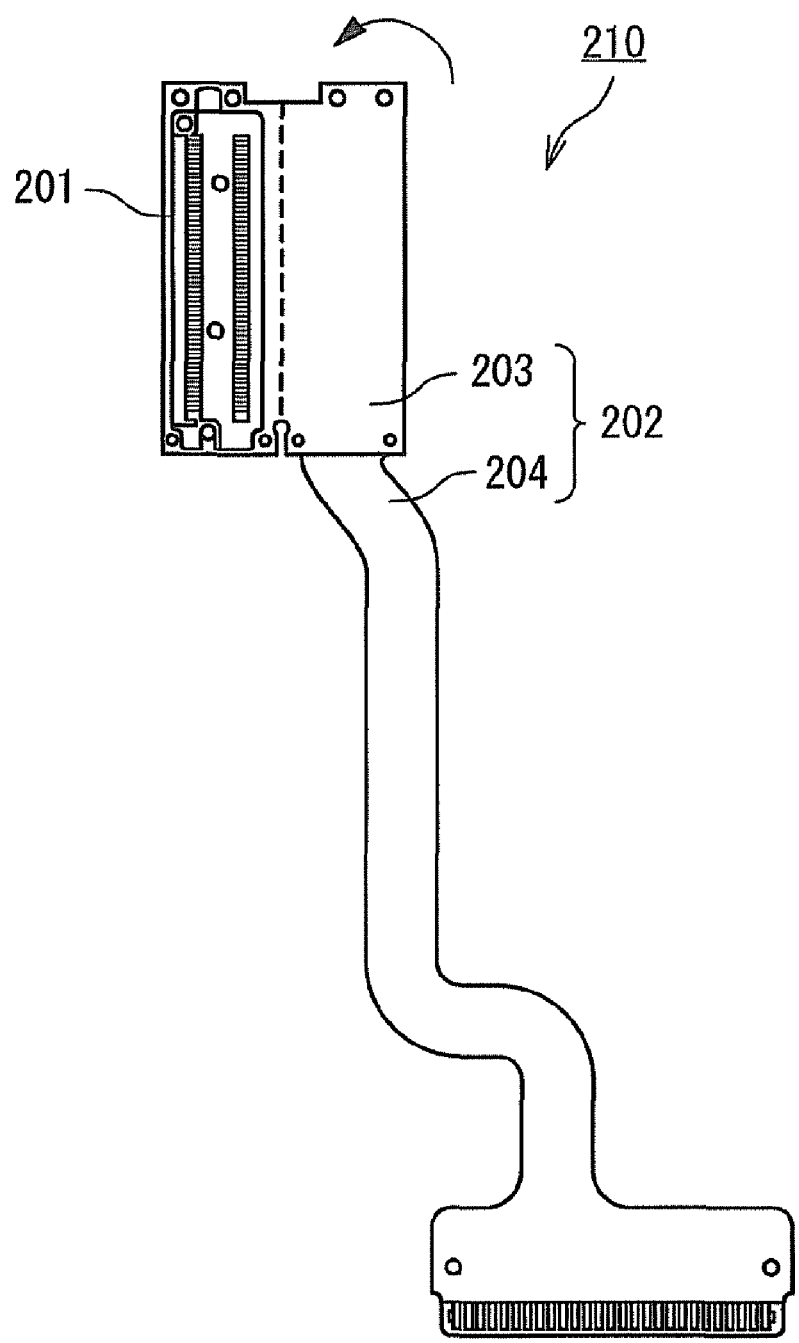
FIG. 9A shows another configuration and folding method of the flexible printed board according to the present invention.
Figure 9B:
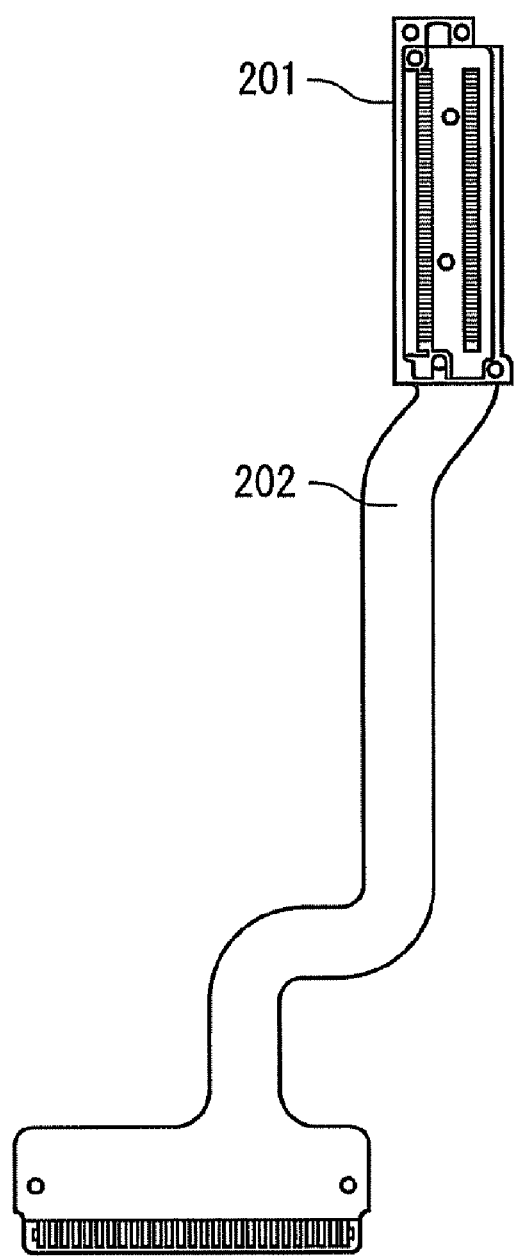
FIG. 9B shows the configuration and folding method of the flexible printed board according to the present invention.

A flexible printed board 210 of the present invention may be only the structure on the right side indicated by the symbol (1) of the flexible printed board 10 shown in FIG. 1, as shown by the flexible printed board 210 in FIG. 9A. Consequently, it is possible to save a space of a mounting region in the same way as mentioned above, by folding a terminal neighboring section 203 (first terminal neighboring section), which is adjacent to a connector mounting section 201 (the first terminal board section), to make a mountain-fold along the dotted line in FIG. 9A in order for the terminal neighboring section 203 to be put on the connector mounting section 201.

Figure 10A:
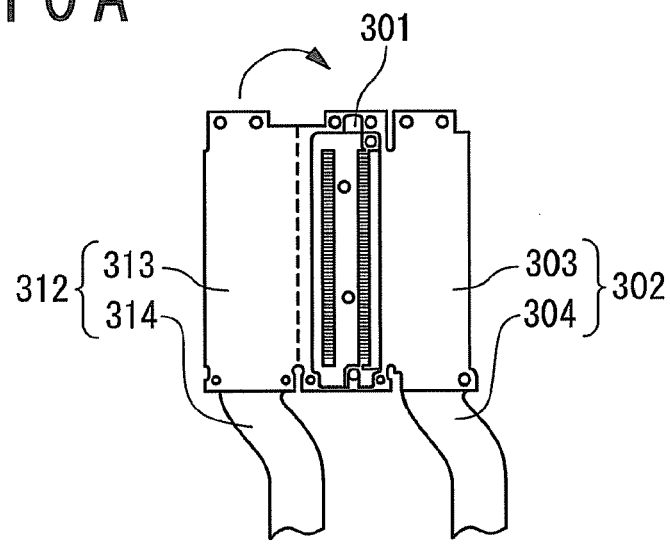
FIG. 10A shows another configuration and folding method of the flexible printed board according to the present invention.

A flexible printed board 310 of the present invention may be a configuration in which terminal neighboring sections 303 and 313 (the first terminal neighboring sections 303 and 313) are formed adjacent to the left and right of a connector mounting section 301 (the first terminal board section 301) positioned at the center of the upper end, as shown by the flexible printed board 310 in FIG. 10A. That is to say, the terminal neighboring sections 303 and 313 are connected to both sides of the single connector mounting section 301. In this case, the terminal neighboring section 313 positioned on the left side is firstly folded at the boundary (folding) line (dotted line) with respect to the connector mounting section 301, and is put on the back side of the connector mounting section 301, as shown in FIG. 10A.

Figure 10B:
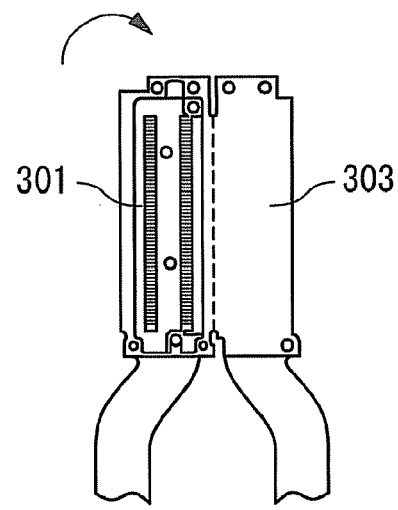
FIG. 10B shows the configuration and folding method of the flexible printed board according to the present invention.
Figure 10C:
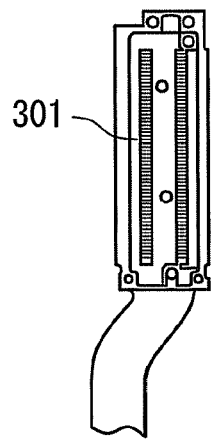
FIG. 10C shows the configuration and folding method of the flexible printed board according to the present invention.

Then, the terminal neighboring section 303 on the right side is folded at the boundary (folding) line (dotted line) with respect to the connector mounting section 301 from the state of FIG. 10B, to be put on the back side of the connector mounting section 301, namely, to be put on the terminal neighboring section 313, which has already been folded. As a result, the state of FIG. 10C makes it possible to save a space of a mounting region in the same way as mentioned above. At this time, terminals may be formed on a portion indicated by the symbol 303.

Figure 11:
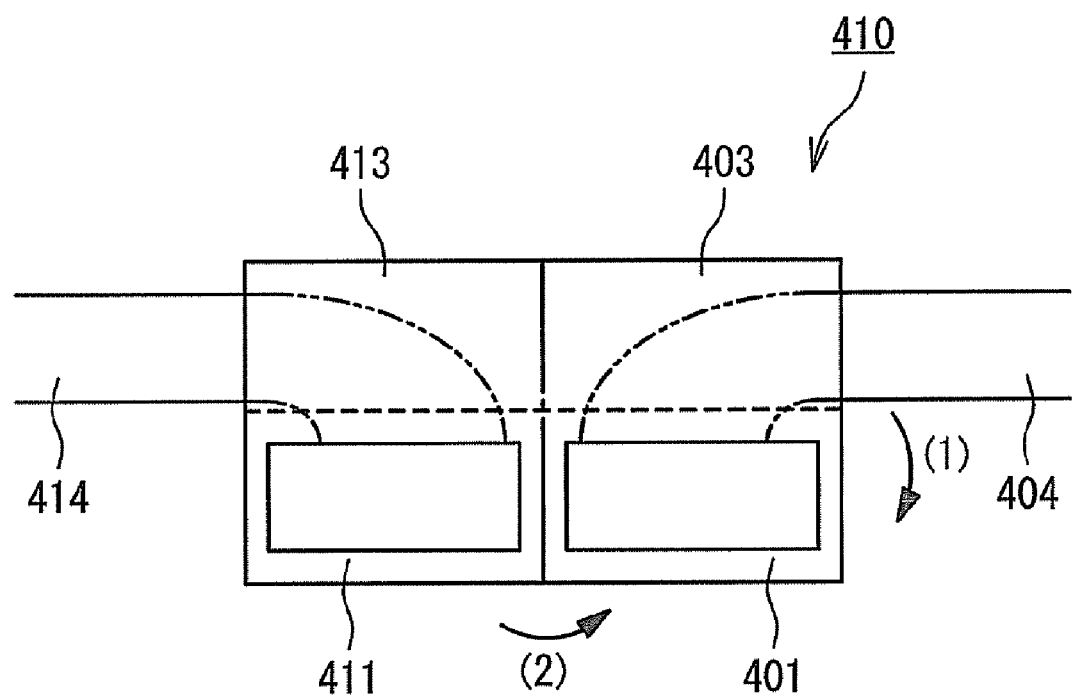
FIG. 11 shows another configuration and folding method of the flexible printed board according to the present invention.

Furthermore, a flexible printed board of the present invention may be a configuration as shown in FIG. 11. This flexible printed board 410 is formed as a configuration that the structure on the right side indicated by the symbol (1) and the structure on the left side indicated by the symbol (2) of the above-mentioned flexible printed board 10 shown in FIG. 1, are connected on the side of the upper end. That is to say, two rectangular connector mounting sections 401 and 411 (the first terminal board section 401 and the second terminal board section 411) are arranged in a line to be connected at the short sides while terminal neighboring sections 403 and 413 (the first terminal neighboring section 403 and the terminal neighboring section 413) are formed adjacent to the long sides of the connector mounting sections 401 and 411, respectively. Further, in other words, a polyimide layer of approximately a rectangular shape is divided into four sections in the form of a cross, in which the connector mounting sections 401 and 411 and the terminal neighboring sections 403 and 413 are formed. Interconnection sections 404 and 414 (the first interconnection section 404 and the second interconnection section 414) are connected to the short sides of the terminal neighboring sections 403 and 413.

In the flexible printed board 410 shown in FIG. 11 mentioned above, a mountain-fold is firstly made along the dotted line such that the two terminal neighboring sections 403 and 413 are put on the back side of the connector mounting sections 401 and 411 adjacent thereto, as indicated by the arrow (1). After that, the connector mounting sections 401 and 411 are folded such that a mountain-fold is made along the boundary (folding) line (the chain line; a folding line between the terminal board sections) between the connector mounting sections 401 and 411, as indicated by the arrow (2), in order to be positioned on the surface and back sides. As a result, the terminal neighboring sections 403 and 413 are positioned to be put on each other between the connector mounting sections 401 and 411, making it possible to save a space of a mounting region.

The flexible printed board 10 according to the present invention can be mounted on such an electronic apparatus as a cellular phone and has industrial applicability, which in particular, is effective for a folding electronic apparatus in which connection is required between bendable housings.

The flexible printed board of the present invention is characterized in that the flexible printed board has a terminal section having terminals and an interconnection board section having interconnections to be connected to the terminals, and is formed to be foldable such that a terminal neighboring section adjacent along a longitudinal direction of the terminal board section is put on the side opposite to a terminal formation surface of the terminal board section.

According to the above-mentioned invention, the terminal neighboring section within the interconnection board section, which is adjacent to the terminal board section, is firstly folded to be put on the back side of the terminal board section. As a result, though a mounting space including the region of the terminal neighboring section is conventionally required when a terminal board section is mounted on an electronic apparatus and so forth since the terminal neighboring section is adjacent to the terminal board section, only the region of the terminal board section is sufficient for a mounting portion according to the present invention since the terminal neighboring section is put on the terminal board section. Therefore, it is possible to save mounting space.

At this time, in the terminal board section, more terminals are arranged along a longitudinal direction of the terminal board section than a direction different from the longitudinal direction. For example, the terminal board section is approximately a rectangular shape, and the terminal neighboring section is formed adjacent to a long side thereof. In the terminal neighboring section, interconnections are arranged over a region wider than other portions of the interconnection board section, in accordance with positions of the respective terminals of the terminal board section.

In case of the above-mentioned configuration, distances between interconnections become large in the terminal neighboring section in accordance with arrangement of terminals in the terminal board section, especially arrangement where a lot of terminals are arranged in a longitudinal direction. That is to say, though it is normally possible in the interconnection board section, to concentrate only interconnections and save a space by forming a plurality of layers, a wider mounting space is required in the terminal neighboring section since the interconnections are provided over a wider region. As mentioned above, however, it is possible to more efficiently save a space by folding the terminal neighboring section so as to be put on the terminal board section according to the present invention.

Also, the present invention is characterized in that the terminal neighboring section is a shape which is approximately the same as or smaller than the terminal board section. Consequently, it is possible to more effectively save a space since the terminal neighboring section to be put on the terminal board section when being folded does not protrude therefrom.

Furthermore, the flexible printed board of the present invention is a flexible printed board having a pair of flexible printed boards which include the above-mentioned terminal board sections and interconnection board sections, and is characterized in that the flexible printed board mutually connects both the terminal board sections and/or both the terminal neighboring sections and is symmetrically formed to be foldable with a connection portion. For example, the flexible printed board of the present invention is characterized in that a flexible printed board is a pair of flexible printed boards which include terminal board sections and interconnection board sections, and the flexible printed board mutually connects both the terminal board sections while connecting terminals of both the terminal board sections with interconnections, and is symmetrically formed so as to be foldable with respect to this connection portion. Also, it is a characterized in that both terminal board sections are mutually positioned on the surface and back sides and the respective terminal formation surfaces of both the terminal board sections are exposed outside after the folding. Consequently, the flexible printed board having the terminals on both surfaces can be formed in a saved space.

Also, it is characterized in that bonding material for bonding contact faces at the time of folding, is provided. Consequently, it is possible to prevent a folded flexible printed board from opening and improve reliability of an apparatus after the mounting.

Also, the present invention is characterized in that a notch section and/or through-holes are formed at a folding portion, to reduce strength less than other portions. Consequently, the folding is easy and resilience after the folding is lowered to stabilize the folded state, making it possible to improve reliability of an apparatus after the mounting.

Additionally, the present invention provides an electronic apparatus to which the above-mentioned flexible printed board is mounted, e.g. a cellular phone. In this way, by mounting the flexible printed board which can save a space of a mounting part on such an electronic apparatus as a cellular phone, further miniaturization of the electronic apparatus is possible.

Additionally, a method of folding the above-mentioned flexible printed board according to the present invention is characterized in that a terminal neighboring section is folded toward the side opposite to a terminal formation surface such that the terminal formation surface of a terminal board section is exposed outside.

In particular, the flexible printed board having a pair of flexible printed boards which include terminal board sections and interconnection board sections, is folded such that both the terminal board sections are positioned on the surface and back sides and each terminal formation surface is exposed outside, as mentioned above. More in detail, the present invention is characterized that each terminal neighboring section is folded on the back sides of the terminal board sections adjacent thereto, and further folded such that the folded terminal neighboring sections oppose to each other, in order to position both the terminal board sections on the surface and back sides and expose the terminal formation surfaces outside.

In this way, it is possible to save a mounting space of a flexible printed board and miniaturize an electronic apparatus for the printed board to be mounted, as mentioned above.

What is claimed is:

1. A flexible printed board comprising:
   a first terminal board section having a terminal formation surface on which terminals are formed; and
   a first interconnection board section having interconnections to be connected to the terminals;
   wherein said first interconnection board section comprises:
   a first terminal neighboring section arranged in adjacent to said first terminal board section; and
   a first interconnection section arranged in adjacent to said first terminal neighboring section,
   a width of a portion of said first terminal neighboring section where said interconnections are arranged is wider than that of said first interconnection section, and
   a boundary portion between said first terminal board section and said first terminal neighboring section is formed to be foldable such that said first terminal neighboring section is put on a surface of said first terminal board section opposite to said terminal formation surface, further comprising:
   a terminal board section folding line; and
   a second terminal board section having one of surfaces where terminals are formed,
   wherein said second terminal board section is arranged to be line-symmetry with said first terminal board section with respect to said terminal board section folding line.

2. The flexible printed board according to claim 1, wherein said first terminal board section has a rectangular shape,
   more ones of said terminals are arranged on a long side of said first terminal board section than a short side thereof, and
   said first terminal neighboring section is arranged in adjacent to the long side of said terminal board section.

3. The flexible printed board according to claim 1, wherein said first terminal neighboring section is smaller in shape than said first terminal board section.

4. The flexible printed board according to claim 1, wherein said first terminal board section and said second terminal board section are connected through said terminal board section folding line,
   said terminals of said first terminal board section terminal are connected with said terminals of said second terminal board section by interconnections to cross said terminal board section folding line.

5. The flexible printed board according to claim 1, further comprising:
   a second terminal neighboring section arranged in adjacent to said first terminal board section on a side opposite to said first terminal neighboring section with respect to said first terminal board section,
   wherein said terminal board section folding line is provided between said first terminal neighboring section and said second terminal neighboring section, and
   said second terminal board section is arranged in adjacent to said second terminal neighboring section on a side opposite to said first terminal neighboring section.

6. The flexible printed board according to claim 1, wherein said second terminal board section is adjacent to a short side of said first terminal board section, and
   said first terminal neighboring section is adjacent to a long side of said first terminal board section.

7. The flexible printed board according to claim 1, wherein said flexible printed board is possibly folded along said terminal board section folding line such that the surfaces of said first terminal board section and said second terminal board section on which the terminal are formed are exposed.

8. The flexible printed board according to claim 1, wherein said first interconnection board section is provided on each side of said first terminal board section.

9. The flexible printed board according to claim 1, further comprising:
   a bonding material which mutually bonds contact surfaces at a time of folding.

10. The flexible printed board according to claim 1, wherein a strength of said boundary portion between said first terminal board section and said first terminal neighboring section is lower than that of a peripheral portion.

11. The flexible printed board according to claim 1, wherein a notch portion or through-holes are provided for said boundary portion between said first terminal board section and said first terminal neighboring section.

12. An electronics equipment comprising:
    a flexible printed board; and
    an upper portion and a lower portion connected through a hinge portion,
    wherein said flexible printed board is arranged to pass through said hinge portion and to extend into said upper portion and said lower portion,
    wherein said flexible printed board comprises:
    a first terminal board section having a terminal formation surface on which terminals are formed;
    a first interconnection board section having interconnections to be connected to the terminals;
    a terminal board section folding line; and
    a second terminal board section having one of surfaces where terminals are formed
    wherein said second terminal board section is arranged to be line-symmetry with said first terminal board section with respect to said terminal board section folding line,
    wherein said first interconnection board section comprises:
    a first terminal neighboring section arranged in adjacent to said first terminal board section; and
    a first interconnection section arranged in adjacent to said first terminal neighboring section,
    a width of a portion of said first terminal neighboring section where said interconnections are arranged is wider than that of said first interconnection section, and
    a boundary portion between said first terminal board section and said first terminal neighboring section is formed to be foldable such that said first terminal neighboring section is put on a surface of said first terminal board section opposite to said terminal formation surface.

13. A mobile phone comprising:
    a flexible printed board; and
    an upper portion and a lower portion connected through a hinge portion,
    wherein said flexible printed board is arranged to pass through said hinge portion and to extend into said upper portion and said lower portion,
    wherein said flexible printed board comprises:

a first terminal board section having a terminal formation surface on which terminals are formed;
a first interconnection board section having interconnections to be connected to the terminals;
a terminal board section folding line; and
a second terminal board section having one of surfaces where terminals are formed
wherein said second terminal board section is arranged to be line-symmetry with said first terminal board section with respect to said terminal board section folding line,
wherein said first interconnection board section comprises:
a first terminal neighboring section arranged in adjacent to said first terminal board section; and
a first interconnection section arranged in adjacent to said first terminal neighboring section,
a width of a portion of said first terminal neighboring section where said interconnections are arranged is wider than that of said first interconnection section, and
a boundary portion between said first terminal board section and said first terminal neighboring section is formed to be foldable such that said first terminal neighboring section is put on a surface of said first terminal board section opposite to said terminal formation surface.

* * * * *